United States Patent [19]

Gaynor et al.

[11] Patent Number: 5,939,939
[45] Date of Patent: Aug. 17, 1999

[54] POWER COMBINER WITH HARMONIC SELECTIVITY

[75] Inventors: Michael P. Gaynor, Elgin; John E. Lawrence, Roselle; Ross J. Lahlum, Jr., Mount Prospect, all of Ill.

[73] Assignee: Motorola, Inc., Achaumburg, Ill.

[21] Appl. No.: 09/032,585

[22] Filed: Feb. 27, 1998

[51] Int. Cl.$^6$ ............................... H03F 3/68; H01P 5/12
[52] U.S. Cl. ..................... 330/124 R; 333/128; 455/83
[58] Field of Search ............................ 330/124 R, 302, 330/306; 333/124, 127, 128; 455/78, 80–83

[56] References Cited

U.S. PATENT DOCUMENTS

| | | | |
|---|---|---|---|
| 2,774,069 | 12/1956 | Parker | 333/124 X |
| 3,132,313 | 5/1964 | Alford | 333/32 |
| 4,719,435 | 1/1988 | Maitre | 333/224 |
| 5,023,866 | 6/1991 | DeMuro | 370/278 |
| 5,095,285 | 3/1992 | Khatibzadeh | 330/306 |
| 5,146,178 | 9/1992 | Nojima et al. | 330/306 X |
| 5,274,341 | 12/1993 | Sekine et al. | 330/306 X |
| 5,438,684 | 8/1995 | Schwent et al. | 455/553 |
| 5,694,085 | 12/1997 | Walker | 330/302 X |
| 5,805,023 | 9/1998 | Fukuden | 330/302 |

OTHER PUBLICATIONS

Ron Stegens, Veritech Microwave, Inc., *Microwaves & RF*, "Learn to Fold the Wilkinson Hybrid Divider", May 1993, pp. 163, 164, 169.

Karl B. Niclas, Watkins–Johnson Co., Microwave Journal, Planar Power Combining for Medicum Power GaAs FET Amplifiers in X/$K_u$–Bands, Jun. 1979, pp. 79–84.

Peter Miller, Motorola, Vol. 33 of Motorola Technical Developments, "A Self Tuned Loop Antenna", Dec. 1997, 4 Pages.

The Wilkinson Power Divider, 5 Pages.

*Primary Examiner*—Paul Gensler
*Attorney, Agent, or Firm*—Brian M. Mancini

[57] ABSTRACT

A power amplifier (517) for amplifying an operating signal includes an amplifier (538), an amplifier (540), and a power combiner (518) with harmonic selectivity. The power combiner (518) includes a transmission line section (541), a transmission line section (545), and a resistor (554). The transmission line section (541) is coupled to an amplifier output of the amplifier (538), and the transmission line section (545) is coupled to an amplifier output of the amplifier (540) and to the transmission line section (541). A capacitor (546) is coupled in parallel to a transmission line section (542) of the transmission line section (541), and a capacitor (548) is coupled in parallel to a transmission line section (544) of the transmission line section (545).

22 Claims, 6 Drawing Sheets

POWER COMBINER WITH HARMONIC SELECTIVITY

FIELD OF THE INVENTION

The present invention relates generally to the field of power combiners for amplifiers, and more particularly to the field of power combiners for power amplifiers of transmitters.

BACKGROUND OF THE INVENTION

Figure 1:
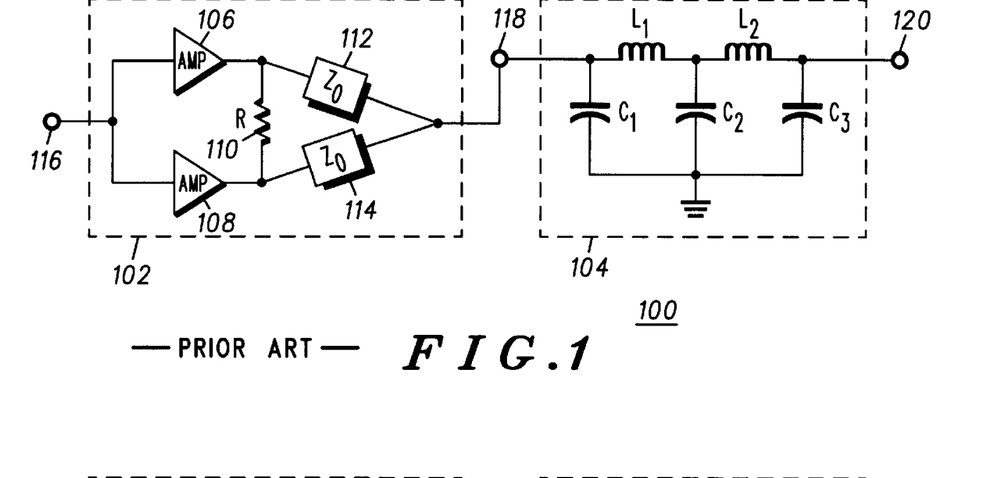
FIG. 1 is a schematic diagram of a power amplifier and a harmonic filter of the prior art, where the power amplifier includes a Wilkinson power combiner and the harmonic filter consists of inductors and capacitors.

FIG. 1 shows an electronic circuit 100 of the prior art, which includes a power amplifier 102 coupled to a harmonic filter 104. Power amplifier 102, which includes a Wilkinson power combiner, has an amplifier 106, an amplifier 108, a resistor 110, a transmission line section 112, and a transmission line section 114 coupled as shown. Harmonic filter 104 consists of several discrete electrical components such as capacitors and inductors. When an operating signal is applied at an input 116, power amplifier 102 provides for linear amplification which results in an amplified operating signal at an output 118. Due to non-idealities of amplifiers 106 and 108, however, power amplifier 102 also generates undesirable signals such as harmonic signals at output 118. Typically, such harmonic signals can be reduced in amplifiers 106 and 108 only with a resulting undesirable tradeoff in amplifier efficiency. Capacitance and inductance values of the capacitors and inductors of harmonic filter 104 are selected to reject or filter out such harmonic signals, resulting in an amplified and filtered operating signal at an output 120.

Figure 2:
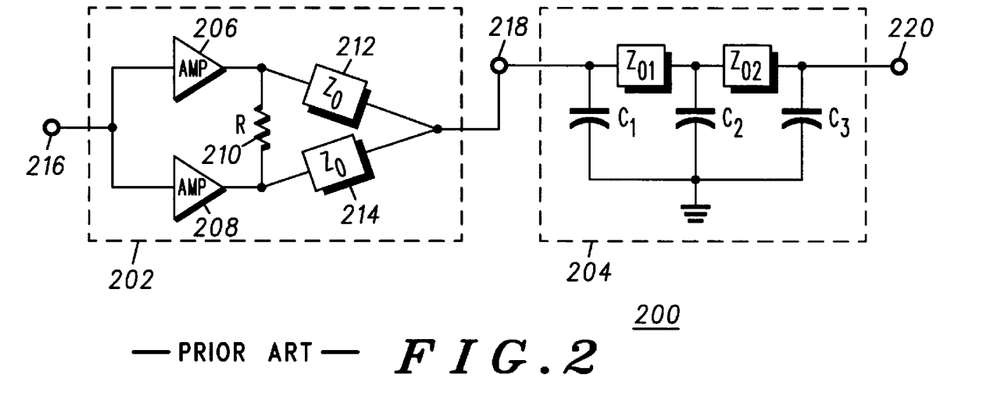
FIG. 2 is a schematic diagram of a power amplifier and a harmonic filter of the prior art, where the power amplifier includes a Wilkinson power combiner and the harmonic filter consists of transmission line sections and capacitors.

FIG. 2 shows another circuit of the prior art, an electronic circuit 200 including a power amplifier 202 and a harmonic filter 204. Power amplifier 202, which includes a Wilkinson power combiner mentioned above, has an amplifier 206, an amplifier 208, a resistor 210, a transmission line section 212, and a transmission line section 214 coupled as shown. When an operating signal is applied at an input 216, power amplifier 202 generates an amplified operating signal and harmonic signals at an output 218. Harmonic filter 204 consists of transmission line sections and capacitors having electrical values selected to reject such harmonic signals, resulting in an amplified and filtered operating signal at an output 220.

Figure 3:
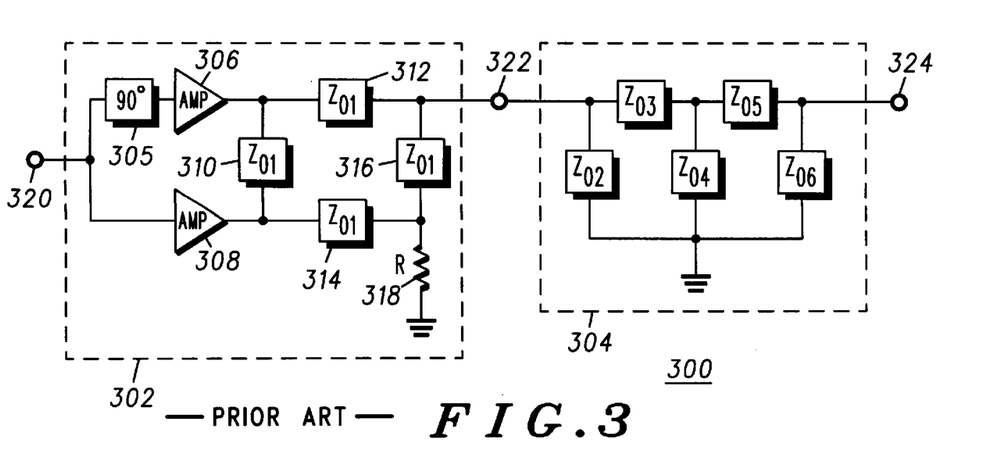
FIG. 3 is a schematic diagram of a power amplifier and a harmonic filter of the prior art, where the power amplifier includes a ninety-degree hybrid power combiner and the harmonic filter consists of transmission line sections.

FIG. 3 shows another circuit of the prior art, an electronic circuit 300 including a power amplifier 302 and a harmonic filter 304. Power amplifier 302, which includes a ninety-degree hybrid power combiner, has a phase shifter 305, an amplifier 306, an amplifier 308, transmission line sections 310, 312, 314, and 316, and a resistor 318 coupled as shown. When an operating signal is applied at an input 320, power amplifier 302 generates an amplified operating signal and harmonic signals at an output 322. Harmonic filter 304 consists of transmission line sections having impedances chosen to filter out harmonic signals, resulting in an amplified and filtered operating signal at an output 324. In the prior art, power amplifiers 102, 202, and 302 of FIGS. 1-3 have been used interchangeably with harmonic filters 104, 204, and 304.

Although electronic circuits 100, 200, and 300 of the prior art function as required, they include many electrical components which together consume a great deal of physical space on a substrate and allow for considerable signal loss of the operating signal. Accordingly, there is a need for power amplifier and filter circuitry that consumes less physical space and allows for less signal loss of the operating signal, and circuitry especially suitable for high-powered radio transmitters.

DETAILED DESCRIPTION OF THE PREFERRED EMBODIMENTS

A power combiner with harmonic selectivity includes a first impedance matching network and a second impedance matching network. The first impedance matching network has a first input and a first output, where the first input is for coupling with a first amplifier output. The second impedance matching network has a second input and a second output, where the second input is for coupling with a second amplifier output and the second output is coupled to the first output. At least a first electrical component is coupled in parallel to at least a second electrical component of the first impedance matching network. The at least a first and second electrical components operate in combination to substantially reject a harmonic signal of an operating signal.

Figure 4:
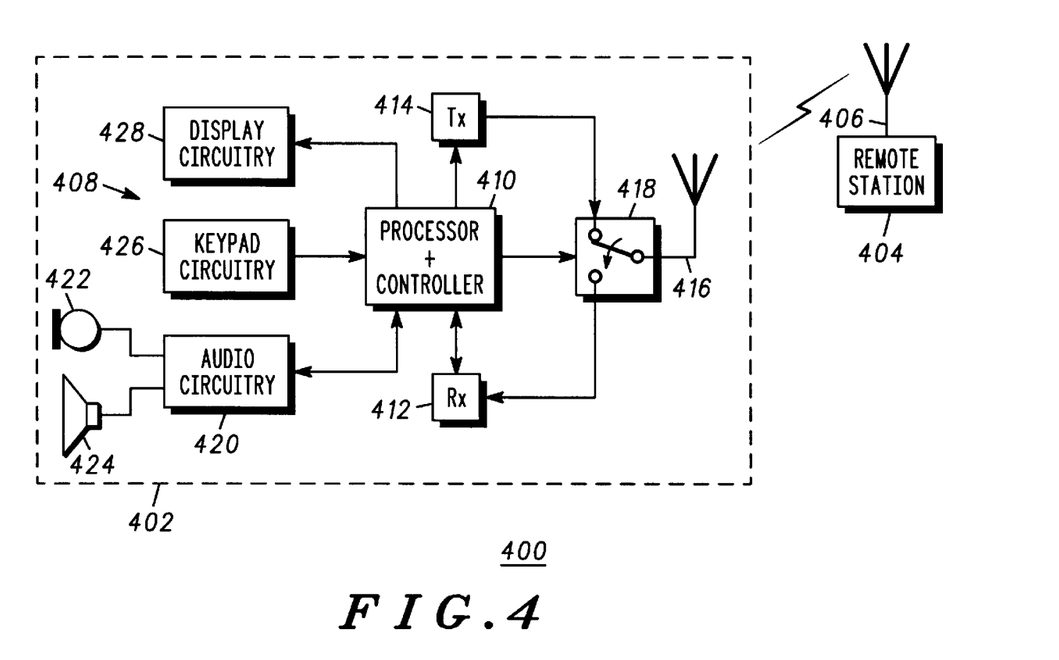
FIG. 4 is a block diagram of a communication system, which includes a mobile station and a remote station, and a schematic diagram of electrical circuitry of the mobile station.

FIG. 4 is a block diagram of a communication system 400, which includes a mobile station 402 and a remote station 404, and a schematic diagram of electrical circuitry 408 of mobile station 402. Remote station 404 includes a radio transceiver (not shown) coupled to an antenna 406 for communicating with mobile station 402 using radio frequency (RF) signals. Electrical circuitry 408 of mobile station 402 includes processor and controller circuitry 410, a receiver 412, a transmitter 414, an antenna 416, an antenna switch 418, audio circuitry 420, a microphone 422, a speaker 424, keypad circuitry 426 (for a keypad, not shown), and display circuitry 428 (for a display, not shown), coupled as shown. Processor and controller circuitry 410 are used to control receiver 412, transmitter 414, and antenna switch 418, and to process signals received by receiver 412 and generate signals for transmission by transmitter 414.

Here, mobile station 402 is a portable radiotelephone, such as a satellite subscriber unit, and communication system 400 is a satellite communication system. Electrical circuitry 408 is disposed in a portable housing (not shown) of mobile station 402, and operates with electrical energy from a detachable battery (not shown) carried on the portable housing.

Figure 5:
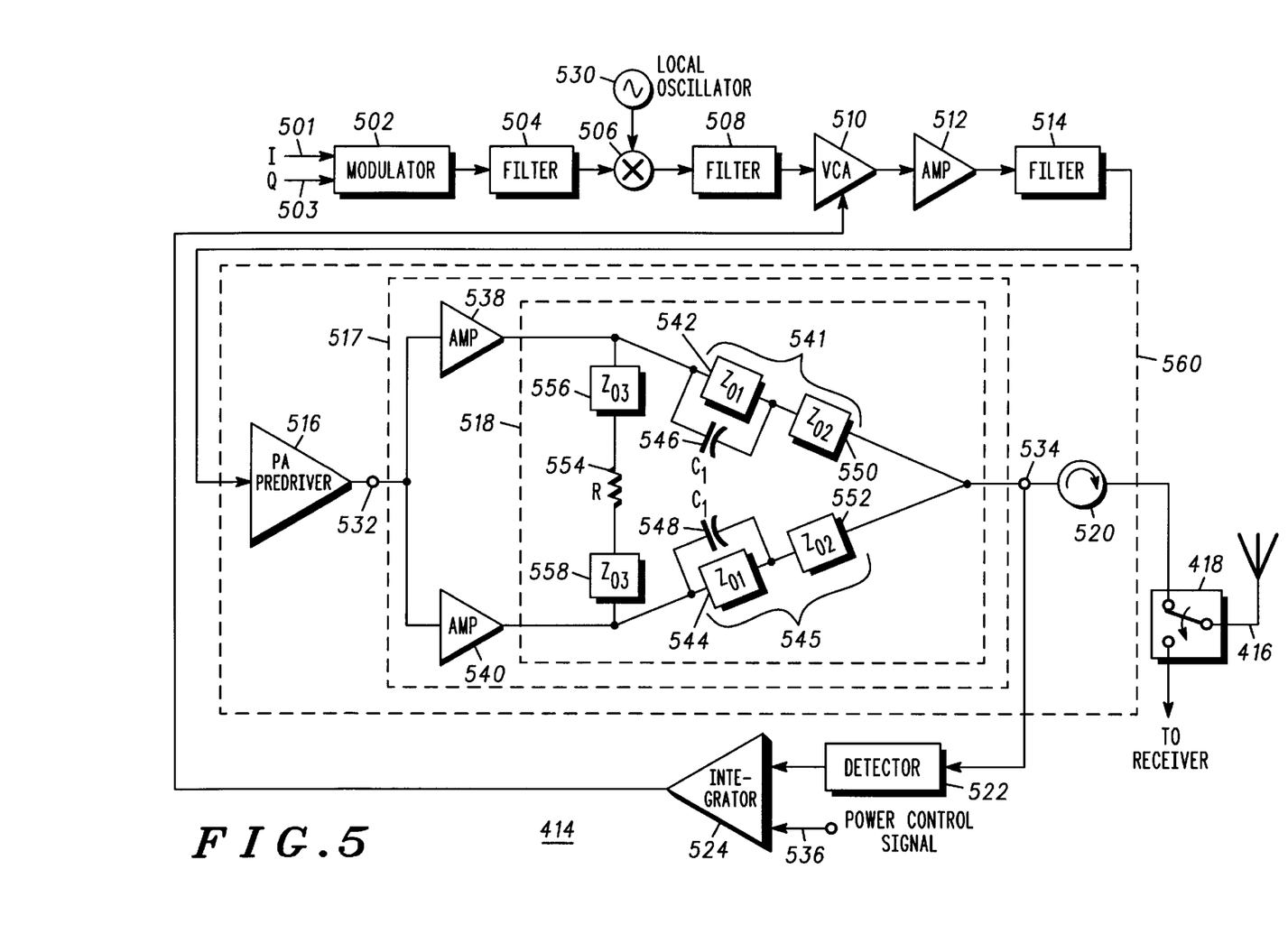
FIG. 5 is a schematic diagram of a transmitter of the mobile station, the transmitter including a power amplifier coupled to a first embodiment of a power combiner with harmonic selectivity.

FIG. 5 is a schematic diagram of transmitter 414 of mobile station 402, which includes a power amplifier 517 having a first embodiment of a power combiner 518 with harmonic selectivity. Transmitter 414 includes a modulator 502, a filter 504, a mixer 506, a local oscillator 530, a filter 508, a voltage-controlled amplifier (VCA) 510, an amplifier 512, a filter 514, a power amplifier (PA) predriver 516, power amplifier 517, an isolator 520, a detector 522, and an integrator 524. Preferably, PA predriver 516, power amplifier 517, and isolator 520 are manufactured on an integrated circuit (IC) 560.

An I line 501 and a Q line 503 are coupled to modulator 502 for passing digital I and Q signals thereto. The I and Q signals, which are digital signals, modulate a signal in modulator 502. The modulated signal is passed through filter 504 to mixer 506. A local oscillator (LO) signal is generated by local oscillator 530 and is mixed with the modulated signal in mixer 506. The resultant signal, which has a frequency between 1616–1626 MHz, is passed through filter 508 to VCA 510, which amplifies based on feedback from integrator 524. The signal is amplified further by amplifier 512 and filtered through filter 514. The resultant signal is passed through PA predriver 516 and power amplifier 517 for linear amplification. The amplified RF signal is passed through isolator 520 and antenna switch 418 to antenna 416 for transmission over a wireless channel. The feedback from integrator 524 is generated in response to signals from a power control input 536, which is coupled to processor and controller circuitry 410 of FIG. 4, and detector 522, which is coupled to an output 534 of power amplifier 517.

Power amplifier 517, which has an input 532 and output 534, includes an amplifier 538, an amplifier 540, and power combiner 518. In this embodiment, amplifiers 538 and 540 are linear amplifiers, which tend to produce harmonic signals during amplification due to non-idealities. Preferably, amplifiers 538 and 540 include field-effect transistors (FETs) biased between about −2.4 to −2.7 volts, where combined linear amplification results in an output power of up to 7 watts.

Power combiner 518 may be viewed as a Wilkinson power combiner with modifications made for harmonic selectivity. Power combiner 518 includes transmission line sections 541 and 545, and a resistor 554. Each of transmission line sections 541 and 545 is an impedance matching network of power combiner 518. One end of transmission line section 541 is coupled to an amplifier output of amplifier 538, and one end of transmission line section 545 is coupled to an amplifier output of amplifier 540. The other end of transmission line section 541 is coupled to the other end of transmission line section 545, forming output 534 of power amplifier 517.

A capacitor 546 is coupled in parallel to a transmission line section 542 of transmission line section 541, leaving a transmission line section 550 (or sections) remaining. A capacitor 548 is coupled in parallel to a transmission line section 544 of transmission line section 545, leaving a transmission line section 552 (or sections) remaining.

In general, power amplifier 517 is operative to amplify an operating signal having a wavelength of λ. During amplification, amplifiers 538 and 540 tend to generate signals such as harmonic signals of the operating signal. An electrical length of transmission line section 542 and a capacitance of capacitor 546 are selected to produce a filter characteristic having a notch to substantially reject or filter out a second harmonic signal of the operating signal; that is, the filter characteristic forms a "zero" at the second harmonic signal. Similarly, an electrical length of transmission line section 544 and a capacitance of capacitor 548 are selected to produce a filter characteristic having a notch to substantially reject the second harmonic signal.

In this embodiment, each of transmission line sections 541 and 545 has an electrical length of about λ/4, each of transmission line sections 542 and 544 has an electrical length that is less than λ/8, and each of transmission line sections 550 and 552 has an electrical length that is greater than µ/8. More particularly here, λ is about 18 cm (free space) or 6 cm (on a substrate having a relative permittivity of about 9.8), and each capacitance of capacitors 546 and 548 is about 1 picofarad.

Preferably, transmission line sections 541 and 545 are both made of microstrip, but could be constructed using other suitable techniques such as with stripline or coax. Capacitors 546 and 548 may be in the form of lumped or distributed elements, which may include metal insulator metal (MIM) elements integrated into a substrate.

Power combiner 518 may also include transmission line sections 556 and 558. Transmission line section 556 is coupled to the amplifier output of amplifier 538 in series with resistor 554, and transmission line section 558 is coupled to the amplifier output of amplifier 540 in series with resistor 554. The electrical lengths of transmission line sections 556 and 558 are selected such that a third harmonic signal of the operating signal is similarly filtered or reduced at output 534. In this embodiment, each of transmission line sections 556 and 558 has an electrical length of about λ/15.

Thus, electrical energy of such harmonic signals is reflected back to amplifiers 538 and 540 (the active devices) rather than dissipating in antenna 416 (the load), resulting in additional efficiency gains. Each of capacitors 546 and 548 is chosen to have a high Q of relatively small capacitance at a fundamental frequency of the operating signal for minimal signal loss at the fundamental frequency. As described and shown, such filtering may be achieved using at least one electrical component (e.g., capacitor 546) coupled in parallel to at least one electrical component (e.g., transmission line section 542) of an impedance matching network (e.g., transmission line section 541) of a power combiner. Many variations in electrical lengths and/or values are possible and may be obtained by one skilled in the art using software modeling or other suitable methods.

Figure 6:
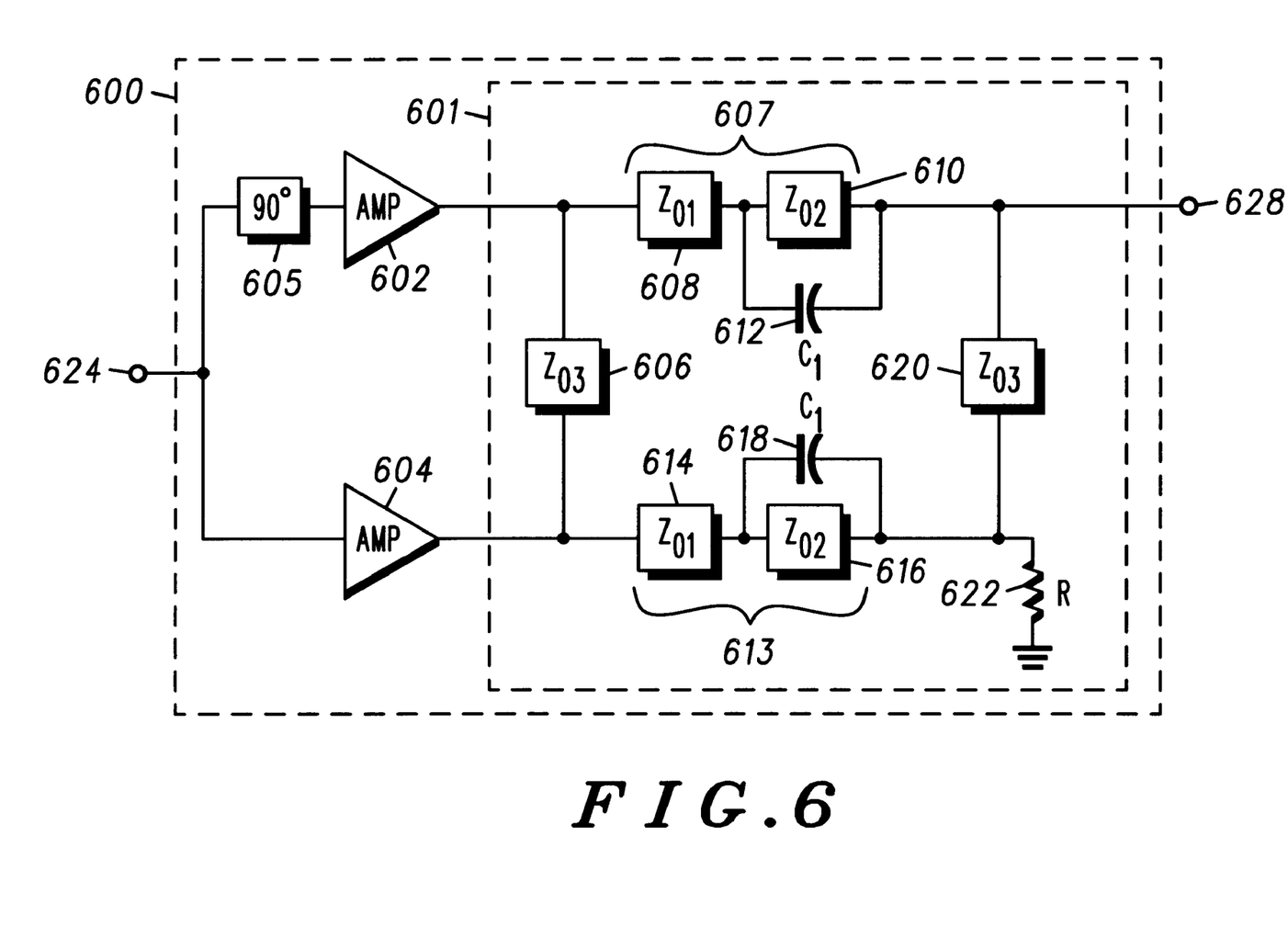
FIG. 6 is a schematic diagram of a power amplifier coupled to a second embodiment of a power combiner with harmonic selectivity.

FIG. 6 is a schematic diagram of a power amplifier 600 including a second embodiment of a power combiner 601 with harmonic selectivity. Power amplifier 600 is substitutable with power amplifier 517 of FIG. 5. Power amplifier 600, which has an input 624 and an output 628, includes an amplifier 602, an amplifier 604, a phase shifter 605, and power combiner 601. Phase shifter 605 is a ninety-degree phase shifter. Amplifiers 602 and 604 are linear amplifiers which tend to produce harmonic signals during amplification due to non-idealities.

Power combiner 601 may be viewed as a ninety-degree hybrid power combiner with modifications made for harmonic selectivity. Power combiner 601 includes transmission line sections 606, 607, 613, and 620, and a resistor 622. A capacitor 612 is coupled in parallel to a transmission line section 610 of transmission line section 607, with a transmission line section 608 (or sections) remaining. Similarly, a capacitor 618 is coupled in parallel to a transmission line section 616 of transmission line section 613, with a transmission line section 614 (or sections) remaining.

Similar to that described in relation to FIG. 5, an electrical length of transmission line section 610 and a capacitance of capacitor 612 are selected to produce a filter characteristic having a notch to substantially reject a second harmonic signal of the operating signal; that is, the filter characteristic forms a "zero" at the second harmonic signal. Similarly, an electrical length of transmission line section 616 and a capacitance of capacitor 618 are selected to produce a filter characteristic having a notch to substantially reject or filter out the second harmonic signal. Thus, the operating signal is amplified and harmonics are filtered at output 628.

In this embodiment, as in that of FIG. 5, each of transmission line sections 606, 607, 613, and 620 has an electrical length of about $\lambda/4$, each of transmission line sections 610 and 616 has an electrical length that is less than $\lambda/8$, and each of transmission line sections 608 and 614 has an electrical length that is greater than $\lambda/8$. Preferably, transmission line sections 606, 607, 613, and 620 are made of microstrip, but could be constructed using other suitable techniques such as with stripline or coax. Capacitors 612 and 618 may be in the form of lumped or distributed elements, and may include MIM elements. Transmission line sections 606 and 620 may be implemented as coupled lines, such as broadside-coupled lines, edge-coupled lines, or other, thereby removing the physical structure of transmission line sections 606 and 620 (with the physical structure of transmission line sections 607 and 613 remaining).

Figure 7:
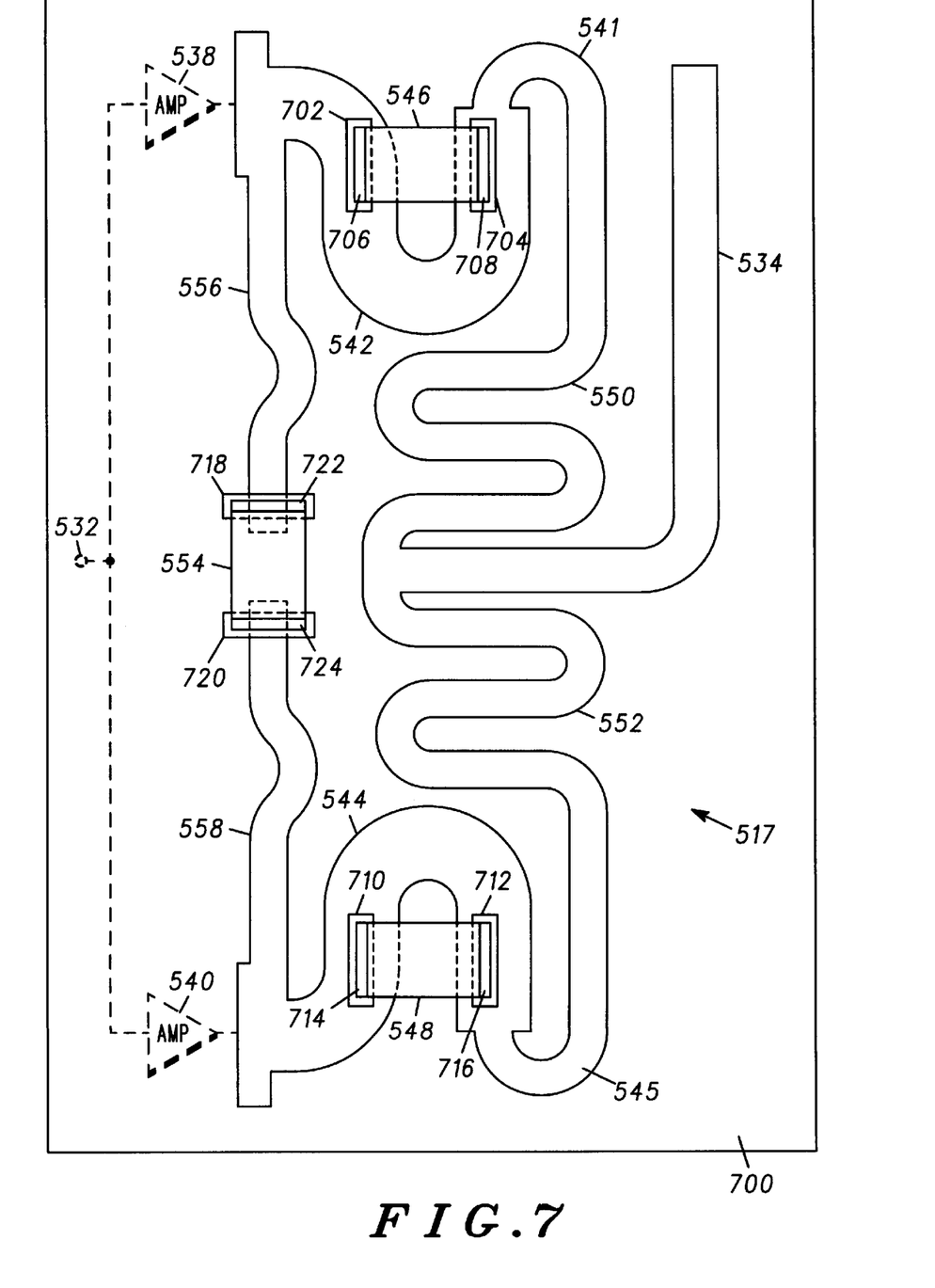
FIG. 7 is a plan view of one example of a substrate including the power combiner with harmonic selectivity of FIG. 5.

FIG. 7 shows a plan view illustration of one example of a substrate 700 having power amplifier 517 of FIG. 5 carried thereon. Substrate 700 and components thereon are shown substantially enlarged (proportionately) for illustrative purposes. Amplifiers 538 and 540, shown in dashed lines, are not component views but shown for representation.

As shown in FIG. 7, transmission line section 541 includes conductive portions 702 and 704 positioned between ends of transmission line section 542. Capacitor 546, which here is a surface mount component, has conductive portions 706 and 708. Conductive portions 702 and 704 are spaced sufficiently on substrate 700 to receive conductive portions 706 and 708, respectively, of capacitor 546, which may be soldered thereto. Similarly, transmission line section 545 includes conductive portions 710 and 712 coupled to ends of transmission line section 544. Capacitor 544, which here is also a surface mount component, has a conductive portions 714 and 716. Conductive portions 710 and 712 are spaced sufficiently on substrate 700 to receive conductive portions 714 and 716, respectively, of capacitor 548, which may be soldered thereto. Transmission line section 556 has an end with a conductive portion 718 and transmission line section 558 has an end with a conductive portion 720. Conductive portions 718 and 720 are spaced sufficiently to receive conductive portions 722 and 724 of resistor 554, which may be soldered thereto.

In this example, transmission line sections 541, 545, 556, and 558 of FIG. 7 are made of microstrip affixed to substrate 700. The microstrip is made of metallized alumina, but could be made from other suitable organic or inorganic materials. As described earlier above, capacitors 546 and 548 may be in the form of lumped or distributed elements, and may include MIM elements integrated into substrate 700.

Power combiner 518 was built substantially as shown in FIGS. 5 and 7 using particular component values. As described above in relation to FIG. 5, $\lambda$ is about 18 cm (free space) or 6 cm (substrate 700 having a relative permittivity of about 9.8). Each of amplifiers 538 and 540 has an output impedance of about 25 ohms, resistor 554 has a resistance of about 50 ohms, each of transmission line sections 542 and 544 has a characteristic impedance of about 37 ohms, each of transmission line sections 550 and 552 has a characteristic impedance of about 54 ohms, each of transmission line sections 556 and 558 has a characteristic impedance of about 50 ohms, and each of capacitors 546 and 548 has a capacitance of about 1 picofarad.

Figure 8:
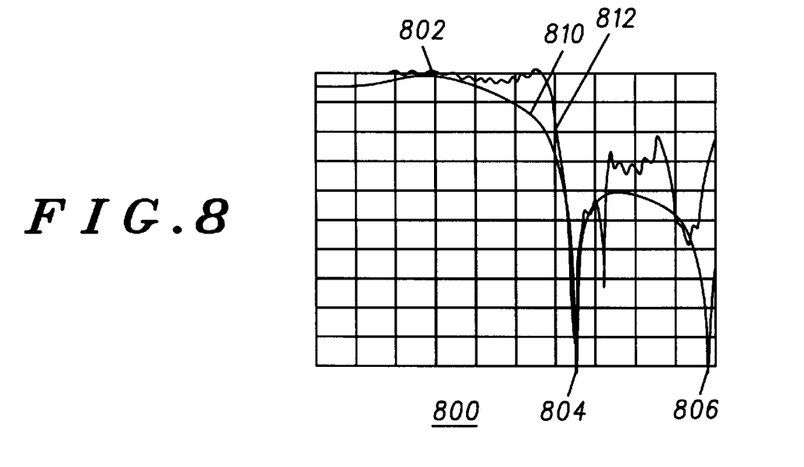
FIG. 8 is a first graph showing filter characteristics of the power combiner with harmonic selectivity of FIG. 5.
Figure 9:
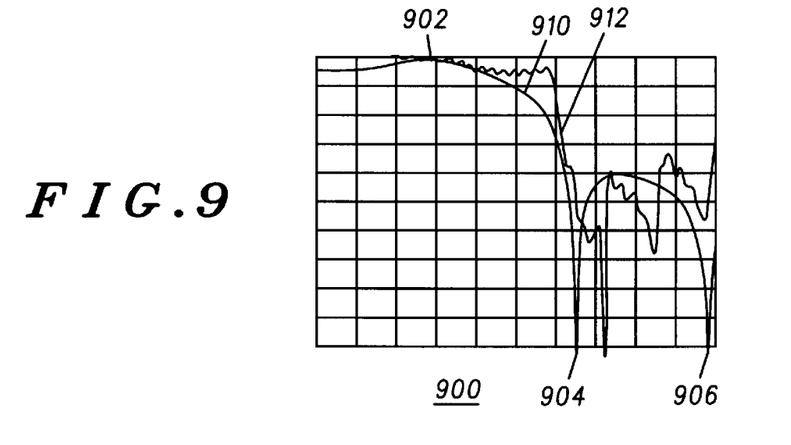
FIG. 9 is a second graph showing filter characteristics of the power combiner with harmonic selectivity of FIG. 5.

FIGS. 8 and 9 are graphs 800 and 900, respectively, each showing filter characteristics of power combiner 518 with the electrical attributes specified above. Graph 800 of FIG. 8 shows an insertion loss characteristic 810 of a computer-generated response and a measured insertion loss characteristic 812 from output 534 to the amplifier output of amplifier 538. Insertion loss characteristic 810 shows a notch 804 at a second harmonic frequency (between about 3232–3252 MHz), which is twice that of a fundamental frequency 802 (between about 1616–1626 MHz) of the operating signal, and a notch 806, which is three times that of fundamental frequency 802. Similarly, graph 900 of FIG. 9 shows an insertion loss characteristic 910 of the computer-generated response and a measured insertion loss characteristic 912 from output 534 to the amplifier output of amplifier 540. Insertion loss characteristic 910 shows a notch 904 at a second harmonic frequency (between about 3232–3252 MHz) which is twice that of a fundamental frequency 902 (between about 1616–1626) of the operating signal, and a notch 906, which is three times that of fundamental frequency 902 of the operating signal. The differences between the computer-generated and the measured characteristics in FIGS. 8 and 9 are due only to parasitics, component availability, and component tolerances.

Figure 10:
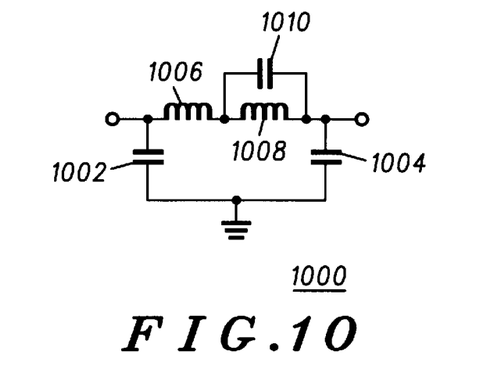
FIG. 10 is an impedance matching network of a power combiner, where the impedance matching network has at least one electrical component for harmonic selectivity.
Figure 11:
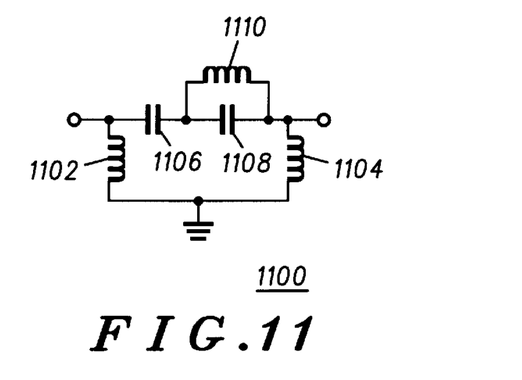
FIG. 11 is another impedance matching network of a power combiner, including at least one electrical component for harmonic selectivity.

FIGS. 10 and 11 show impedance matching networks 1000 and 1100, respectively, each of which includes harmonic selectivity. Impedance matching networks 1000 and 1100 may be substituted for impedance matching networks of power combiners 517 and 601 of FIGS. 5 and 6. In FIG. 10, impedance matching network 1000 includes a capacitor 1002, a capacitor 1004, an inductor 1006, and an inductor 1008. Capacitor 1002 is coupled to an input of impedance matching network 1000 and to a ground, capacitor 1004 is coupled to an output of impedance matching network 1000 and the ground, and inductors 1006 and 1008 are coupled in series in between capacitors 1002 and 1004. At least one electrical component, here a capacitor 1010 coupled in parallel to inductor 1008, is included in impedance matching network 1000. A capacitance of capacitor and an inductance of inductor are chosen to produce a filter characteristic having a notch for filtering out a second harmonic signal of an operating signal.

In FIG. 11, impedance matching network 1100 includes an inductor 1102, an inductor 1104, a capacitor 1106, and a capacitor 1108. Inductor 1102 is coupled to an input of impedance matching network 1100 and to a ground, inductor 1104 is coupled to an output of impedance matching network 1100 and to the ground, capacitors 1106 and 1108 are coupled in series in between inductors 1102 and 1104. At least one electrical component, here an inductor 1110 coupled in parallel to capacitor 1108, is included in impedance matching network 1100. An inductance of inductor 1110 and a capacitance of capacitor 1108 are chosen to produce a filter characteristic having a notch for filtering out a second harmonic signal of an operating signal of impedance matching network 1100. Preferably, in both FIGS. 10 and 11, the capacitance is between about 1–5 picofarads and the inductance is between about 1–15 nanohenries when employed in the embodiment of FIG. 5.

A power combiner with harmonic selectivity as shown and described herein consumes less physical space, allows for less signal loss, and costs less than circuits of the prior art since it contains fewer components providing smaller operating signal loss. Such a power combiner is suitable for use in a radio transmitter of an electronic device (portable or other) or a mobile station having a high power and a low harmonic output requirement. Power combiners 518 and 601 are preferred where lower signal loss components are utilized.

While particular embodiments of the present invention have been shown and described, modifications may be made. For example, it is understood that such power combiners with harmonic selectivity may include more than two impedance matching networks for combining more than two amplifiers. Although power combiners with harmonic selectivity are shown herein as being symmetric, they may be asymmetric as well. A power combiner with harmonic selectivity may be suitably modified into a power divider with input filtering. Two or more power combiners may be cascaded to provide for a wider bandwidth, where harmonic selectivity is similarly incorporated in one or more of the impedance matching networks. For each amplifier, two or more impedance matching networks may be serially coupled to provide for a wider bandwidth, where harmonic selectivity is similarly incorporated in one or more of the impedance matching networks. The electrical components included for selectivity may be easily removed, depending on the design (e.g., as in FIG. 7), for use with conventional harmonic filters. It is therefore intended in the appended claims to cover all such changes and modifications which fall within the true spirit and scope of the invention.

What is claimed is:

1. A power combiner providing harmonic selectivity of at least one harmonic signal of an operating signal, said power combiner comprising:

a first impedance matching network comprising a first capacitance, a second capacitance, a first inductance, and a second inductance coupled in series with said first inductance, said first impedance matching network having a first input and a first output, said first input for coupling with a first amplifier output;

a second impedance matching network, said second impedance matching network having a second input and a second output, said second input for coupling with a second amplifier output, said second output coupled to said first output; and at least a first electrical component comprising a third capacitance, said at least a first electrical component coupled in parallel to at least a second electrical component comprising said first inductance of said first impedance matching network, said at least a first and second electrical components operating in combination to substantially reject at least one harmonic signal of the operating signal.

2. The power combiner according to claim 1, wherein said first impedance matching network comprises a first transmission line section comprising said first and second inductances, said at least a first electrical component comprises a capacitor, and said at least a second electrical component comprises a second transmission line section comprising said first inductance of said first transmission line section.

3. The power combiner according to claim 1, further comprising:

at least a third electrical component comprising a fourth capacitance, said at least a third electrical component coupled in parallel to at least a fourth electrical component comprising a third inductance of said second impedance matching network, said at least a third and fourth electrical components operating in combination to substantially reject the harmonic signal of the operating signal.

4. The power combiner according to claim 1, wherein the operating signal has a wavelength of $\lambda$, said first impedance matching network comprises a first transmission line section comprising said first and second inductances, said at least a first electrical component comprises a first capacitor, said at least a second electrical component comprises a second transmission line section comprising said first inductance of said first transmission line section, and said first transmission line section has a first electrical length of about $\lambda/4$ and said second transmission line section has a second electrical length that is less than $\lambda/8$.

5. A power combiner providing harmonic selectivity of at least one harmonic signal of an operating signal, said power combiner comprising:

a first impedance matching network comprising a first inductance, a second inductance, a first capacitance, and a second capacitance coupled in series with said first capacitance, said first impedance matching network having a first input and a first output, said first input for coupling with a first amplifier output;

a second impedance matching network, said second impedance matching network having a second input and a second output, said second input for coupling with a second amplifier output, said second output coupled to said first output; and at least a first electrical component comprising a third inductance, said at least a first electrical component coupled in parallel to at least a second electrical component comprising said first capacitance of said first impedance matching network, said at least a first and second electrical components operating in combination to substantially reject a harmonic signal of an operating signal.

6. A power amplifier, comprising:

a first amplifier, said first amplifier having a first amplifier input and a first amplifier output;

a second amplifier, said second amplifier having a second amplifier input and a second amplifier output, said second amplifier input coupled to said first amplifier input, said first and said second amplifiers tending to produce a second harmonic signal of an operating signal during amplification;

a first impedance matching network comprising a first capacitance, a second capacitance, a first inductance, and a second inductance of said first impedance matching network, said first and second inductances of said first impedance matching network being coupled in series, said first impedance matching network having a first input and a first output, said first input coupled to said first amplifier output, said first impedance matching network including at least a first electrical component comprising a third capacitance of said first impedance matching network and a second electrical component comprising said first inductance of said first impedance matching network;

a second impedance matching network comprising a first capacitance, a second capacitance, a first inductance, and a second inductance of said second impedance matching network, said first and second inductances of said second impedance matching network being coupled in series, said second impedance matching network having a second input and a second output, said second input coupled to said second amplifier output, said second output coupled to said first output, said second impedance matching network including at least a third electrical component comprising a third capacitance of said second impedance matching network and a fourth electrical component comprising said first inductance of said second impedance matching network;

said at least a first electrical component coupled in parallel to said second electrical component, said at least a first and second electrical components operating in combination to substantially reject the second harmonic signal of the operating signal; and said at least a third electrical component coupled in parallel to said fourth electrical component, said at least a third and fourth electrical components operating in combination to substantially reject the second harmonic signal of the operating signal.

7. The power amplifier according to claim 6, wherein said at least a first electrical component comprises a capacitor, and said first impedance matching network comprises a first transmission line section comprising said first and second inductances of said first impedance matching network, said second electrical component comprises a second transmission line section comprising said first inductance of said first transmission line section of said first impedance matching network, and said at least a third electrical component comprises a capacitor, and wherein said second impedance matching network comprises a third transmission line section comprising said first and second inductances of said second impedance matching network, said fourth electrical component comprises a fourth transmission line section comprising said first inductance of said third transmission line section of said second impedance matching network.

8. The power amplifier according to claim 6, further comprising:

a substrate, said substrate carrying said first, second, third and fourth electrical components.

9. The power amplifier according to claim 6, further comprising:

at least a first resistor;

at least a fifth electrical component, said at least a fifth electrical component coupled between said first amplifier output and said at least a first resistor; and at least an sixth electrical component, said at least an sixth electrical component coupled between said second amplifier output and said at least a first resistor.

10. The power amplifier according to claim 9, wherein said at least a fifth electrical component comprises a first transmission line section and said at least an sixth electrical component comprises a second transmission line section, operating to substantially reject a third harmonic signal of the operating signal.

11. The power amplifier according to claim 6, wherein said transmission line sections are constructed using one of microstrip, stripline, and coax.

12. The power amplifier according to claim 6, wherein said first and said capacitances each comprise one of a lumped element and a distributed element.

13. An electronic device, comprising:

a transceiver, said transceiver operative to generate an operating signal with a wavelength of $\lambda$, said transceiver including:

a first amplifier;

a second amplifier;

a first transmission line section having a first electrical length of about $\lambda/4$, said first transmission line section coupled to a first amplifier output of said first amplifier;

a second transmission line section having a second electrical length of about $\lambda/4$, said second transmission line section coupled to a second amplifier output of said second amplifier and to said first transmission line section;

a first capacitor, said first capacitor coupled in parallel to a third transmission line section of said first transmission line section, said third transmission line section has a third electrical length that is less than $\lambda/8$, said first capacitor and said third transmission line section operative to produce a first filter characteristic for substantially rejecting a second harmonic signal of the operating signal;

a second capacitor, said second capacitor coupled in parallel to a fourth transmission line section of said second transmission line section, said fourth transmission line section has a fourth electrical length that is less than $\lambda/8$, said second capacitor and said fourth transmission line section operative to produce a second filter characteristic for substantially rejecting the second harmonic signal; and an antenna, said antenna for coupling to said first and said second transmission line sections.

14. The electronic device according to claim 13, wherein said first and said second amplifiers each comprise a linear amplifier tending to produce the second harmonic signal.

15. The electronic device according to claim 13, wherein said first, said second, said third, and said fourth transmission line sections each are constructed using one of microstrip, stripline, and coax line, said power amplifier further comprising:

a substrate, said substrate carrying said first, said second, said third, and said fourth transmission line sections and said first and said second capacitors.

16. The electronic device according to claim 13, wherein said transceiver further comprises:

at least a first resistor;

a fifth transmission line section, said fifth transmission line section coupled to said first amplifier output and said at least a first resistor; and a sixth transmission line section, said sixth transmission line section coupled to said second amplifier output and said at least a first resistor.

17. The electronic device according to claim 16, wherein said fifth and said sixth transmission line sections help provide the first and the second filter characteristics, the first and the second filter characteristics for substantially rejecting a third harmonic signal of the operating signal.

18. A power amplifier at least partially disposed on a substrate, said power amplifier comprising:

a first amplifier;

a second amplifier;

a power combiner, including:

a first transmission line section comprising at least a third transmission line section on a portion thereof, said first transmission line section disposed on said substrate and constructed using stripline, said first transmission line section having a first end and a second end, said first end of said first transmission line coupled to a first amplifier output of said first amplifier;

a second transmission line section comprising at least a fourth transmission line section on a portion thereof, said second transmission line section disposed on said substrate and constructed using stripline, said second transmission line section having a first end and a second end, said first end of said second transmission line section coupled to a second amplifier output of said second amplifier, said second end of said second transmission line section forming an output of said power amplifier;

said third transmission line section including first and second conductive portions positioned at ends thereof, said first and said second conductive portions being in proximity to each other on said substrate;

a first capacitor coupled between said first and second conductive portions of said third transmission line section;

said fourth transmission line section including third and fourth conductive portions positioned at ends thereof, said third and said fourth conductive portions being in proximity to each other on said substrate;

a second capacitor coupled between said third and fourth conductive portions of said fourth transmission line section;

a fifth transmission line section, said fifth transmission line section disposed on said substrate and coupled between said first ends of said first and said second transmission line sections; and a sixth transmission line section, said sixth transmission line section disposed on said substrate and coupled between said second ends of said first and said second transmission line sections.

19. The power amplifier according to claim 18, wherein said power amplifier is operative to amplify an operating signal and capacitances of said first and said second capacitors and inductances of said third and said fourth transmission line sections produce a filter characteristic for substantially rejecting a second harmonic signal of the operating signal.

20. A power amplifier at least partially disposed on a substrate, said power amplifier comprising:

a first amplifier;

a second amplifier;

a power combiner, further including:

a first transmission line section comprising at least a third transmission line section on a portion thereof, said first transmission line section affixed to said substrate and constructed using one of microstrip and stripline, said first transmission line section having a first end and a second end, said first end of said first transmission line coupled to a first amplifier output of said first amplifier;

a second transmission line section comprising at least a fourth transmission line section on a portion thereof, said second transmission line section affixed to said substrate and constructed using one of microstrip and stripline, said second transmission line section having a first end and a second end, said first end of said second transmission line section coupled to a second amplifier output of said second amplifier, said second end of said second transmission line section coupled to said second end of said first transmission line section;

said third transmission line section including first and second conductive portions positioned at ends thereof, said first and said second conductive portions being in proximity to each other on said substrate;

a first capacitor coupled between said first and second conductive portions of said third transmission line section;

said fourth transmission line section including third an fourth conductive portions positioned at ends thereof, said third and said fourth conductive portions being in proximity to each other on said substrate; and a second capacitor coupled between said third and fourth conductive portions of said fourth transmission line section.

21. The power amplifier according to claim 20, further comprising:

at least a first resistor;

a fifth transmission line section, said fifth transmission line section having a first end and a second end, said first end of said fifth transmission line section coupled to said first end of said first transmission line section, said second end of said fifth transmission line section coupled to a first end of said at least a first resistor; and a sixth transmission line section, said sixth transmission line section having a first end and a second end, said first end of said sixth transmission line section coupled to said first end of said second transmission line section, said second end of said sixth transmission line section coupled to a second end of said at least a first resistor.

22. An electronic device providing communication with radio frequency (RF) signals, said electronic device comprising:

a receiver;

a transmitter, said transmitter operative to generate an operating signal having a wavelength of $\lambda$, said transmitter including:

a first linear amplifier and a second linear amplifier, said first and said second linear amplifiers operative to amplify the operating signal, said first and said second linear amplifiers tending to generate a second harmonic signal of the operating signal during amplification;

a first transmission line section, said first transmission line section coupled to a first amplifier output of said first linear amplifier and having a first electrical length of about $\lambda/4$;

a second transmission line section, said second transmission line section coupled to a second amplifier output of said second linear amplifier, said second transmission line section having a second electrical length of about $\lambda/4$;

a first capacitor, said first capacitor coupled in parallel to a third transmission line section of said first transmission line section, said third transmission line section having a third electrical length that is less than $\lambda/8$;

a second capacitor, said second capacitor coupled in parallel to a fourth transmission line section of said second transmission line section, said fourth transmission line section having a fourth electrical length that is less than $\lambda/8$;

a fifth transmission line section, said fifth transmission line section coupled between said first and said second amplifier outputs, said fifth transmission line section having a fifth electrical length of about $\lambda/4$;

a sixth transmission line section, said sixth transmission line section coupled between said first and said second transmission line sections, said sixth transmission line section having a sixth electrical length of about $\lambda/4$;

processor and controller circuitry, said processor and controller circuitry coupled to said receiver and said transmitter; and an antenna, said antenna for coupling to an end of said sixth transmission line section.

* * * * *

UNITED STATES PATENT AND TRADEMARK OFFICE
CERTIFICATE OF CORRECTION

PATENT NO. : 5,939,939
DATED : August 17, 1999
INVENTOR(S) : Gaynor, Michael

It is certified that error appears in the above-indentified patent and that said Letters Patent is hereby corrected as shown below:

Title Page

Item [73] Assignee
    In Assignee, replace "Achaumburg" with – Schaumburg--.

Item (56) - Attorney, Agent, or Firm section of
    In Assignee, replace "Brian M. Mancini" with – John J. Oskorep, Brian M. Mancini --.

Signed and Sealed this

Twenty-ninth Day of May, 2001

*Attest:*

NICHOLAS P. GODICI

*Attesting Officer*     *Acting Director of the United States Patent and Trademark Office*